(12) United States Patent
Lapadat et al.

(10) Patent No.: US 6,510,076 B1
(45) Date of Patent: Jan. 21, 2003

(54) VARIABLE READ/WRITE MARGIN HIGH-PERFORMANCE SOFT-ERROR TOLERANT SRAM BIT CELL

(75) Inventors: Curtis Brian Lapadat, Burnaby (CA); Vikram Madhukar Labhe, Burnaby (CA); Gavril Andrei Margittai, West Vancouver (CA); Mamta Bansal, Coquitlam (CA)

(73) Assignee: PMC-Sierra, Inc., Burnaby (CA)

( * ) Notice: Subject to any disclaimer, the term of this patent is extended or adjusted under 35 U.S.C. 154(b) by 0 days.

(21) Appl. No.: 10/073,036

(22) Filed: Feb. 12, 2002

(51) Int. Cl.$^7$ ............................................. G11C 11/00
(52) U.S. Cl. .................... 365/154; 365/156; 365/189.11
(58) Field of Search ................... 365/154, 156, 365/148, 188, 174, 189.11

(56) References Cited

U.S. PATENT DOCUMENTS

| | | | |
|---|---|---|---|
| 4,130,892 A | | 12/1978 | Gunckel, II et al. |
| 4,914,629 A | | 4/1990 | Blake et al. |
| 5,886,375 A | | 3/1999 | Sun |
| 5,889,697 A | * | 3/1999 | Selcuk et al. ............... 365/148 |
| 6,005,797 A | * | 12/1999 | Porter et al. ............... 257/370 |
| 6,087,849 A | | 7/2000 | Zhang |
| 6,091,626 A | * | 7/2000 | Madan ....................... 365/154 |

* cited by examiner

Primary Examiner—David Lam
(74) Attorney, Agent, or Firm—Oyen Wiggs Green & Mutala (57) ABSTRACT

A single event upset (SEU) tolerant SRAM bit cell for six-transistor (6T), eight-transistor (8T), or multi-port RAM cell configurations fabricated in accordance with 0.18 μm or smaller CMOS processes. SEU tolerance is achieved without significantly increasing the cell's read and write cycle time and negligible impact on cell stability.

19 Claims, 8 Drawing Sheets

VARIABLE READ/WRITE MARGIN HIGH-PERFORMANCE SOFT-ERROR TOLERANT SRAM BIT CELL

TECHNICAL FIELD

This invention pertains to single or multi-port SRAM bit cells with improved resistance to α-particle strike-induced soft-error or single event upset (SEU) effects.

BACKGROUND

It is well known that the logic state of a static random access memory (SRAM) bit cell can change if an energetic particle such as an alpha (α) particle strikes the cell. Such "soft-error" or "single event upset" (SEU) effects can occur if an a-particle strike generates, for a sufficient duration, a charge having a magnitude exceeding the critical charge in one of the cell's storage nodes (i.e. the minimum electrical charge needed to change the cell's logic state). Since trace amounts of a-particle emitting constituents are unavoidably found in semiconductor packaging, silicon wafers, and especially in the naturally occurring radioactive lead (Pb) used in "flip-chip" packaging, any modern integrated circuit having a large amount of SRAM is potentially susceptible to a significant soft-error rate (SER).

The prior art has evolved various techniques for minimizing susceptibility to SEU effects. One approach, typified by U.S. Pat. No. 4,130,892 issued Dec. 19, 1978, is to increase the memory cell's charging time constant and thereby decrease the cell's susceptibility to SEU effects. For example, an RC circuit can be interconnected between the two cross-coupled inverter stages in the typical six-transistor (6T) SRAM cell. An undesirable side effect of this approach is that the added capacitance increases the cell's write time; and, may also reduce the cell's stability by reducing the magnitude of the cell's read currents and/or by disrupting the cell's drawn width to drawn length (W/L) ratio, adversely affecting the cell's read/write voltage margins which must be kept within well known limits for correct operation of the cell.

Another prior art approach is to add a small amount of capacitance and/or resistance to each of the cell's storage nodes. However, this significantly increases the cell's integrated circuit surface area, which is undesirable. The required increase in surface area can be reduced through the use of one or more additional high capacitance mask layers in the device fabrication process, but this increases fabrication costs, may reduce production yields, and may compromise with previously established fabrication quality standards which do not take such additional mask layers into account.

Another approach, typified by U.S. Pat. No. 4,914,629 issued Apr. 3, 1990, is to interconnect a pair of transistors between the inverters. The added transistors provide an increased impedance path which delays the time required for voltage changes to occur at the cell's storage nodes, thereby decreasing the cell's susceptibility to SEU effects. However, an α-particle may still strike the drain of one of the added transistors, resulting in an unwanted SEU effect. This problem can be avoided to some extent by usage of P-channel transistors. But a significant SEU problem nonetheless remains and is aggravated in integrated circuit devices fabricated by deep sub-micron processes. Moreover, increased impedance and/or introduction of delay adversely impact cell performance and increase the cell's integrated circuit surface area.

A further approach, typified by U.S. Pat. No. 5,886,375 issued Mar. 23, 1999, is to connect each of the cell's storage nodes to an overlying electrode having a textured surface which is separated from a constant potential plate electrode by a dielectric layer. The textured surface of the overlying electrode provides increased capacitance between the overlying electrode and the constant potential plate electrode, thereby increasing the capacitance of the storage node. However, this approach is again subject to the undesirable side effect of the added capacitance increasing the cell's write time. Furthermore, the extra capacitor layers require non-standard fabrication processes which can increase costs, potentially reduce yields, and increase the complexity of the techniques required to incorporate the resultant SRAM devices in digital circuits.

Yet another approach, typified by U.S. Pat. No. 6,087,849 issued Jul. 11, 2000 is useful in memory cells dominated either by N+ diffusion associated with N-channel field effect transistors (NFETs); or, dominated by P+ diffusion associated with P-channel field effect transistors (PFETs). In the former case, the cell's switching point is shifted toward the cell's negative power supply potential; in the latter case, the cell's switching point is shifted toward the cell's positive power supply potential. Such shifts make it more difficult for an α-particle strike to cause a faulty transition from a logic "high" state to a logic "low" state in the former case; and, more difficult for a faulty transition from a logic "low" state to a logic "high" state to occur in the latter case. However, the low power supply levels prevalent in modern integrated circuit technologies significantly reduce the margins within which such shifts can be made without destabilizing the SRAM bit cell.

A still further approach is to fabricate a keep-out region around each memory cell. The objective of this approach is to ensure that any α-particles emanating from the device's lead balls are completely absorbed as they pass through the device's conductive metal and non-conductive inter-layer dielectric (ILD)/oxide layers before reaching the CMOS substrate. However, such regions unavoidably consume an undesirably large area since the lead balls must often be located in excess of 20–80 μm away from the SRAM memory cells. Moreover, keep-out regions will not shield the memory from α-particles emitted by the very wafer material on which the memory is fabricated.

Since most α-particle induced SRAM SEU effects have been observed to result in single-bit errors, error detection and correction (ECC) circuits have been developed to compensate for such errors. However, ECC circuits significantly and undesirably increase a SRAM's read/write cycle times. Some applications can not tolerate such increased cycle times, even if pipelining techniques are used. For SRAMs with narrow bus widths, the extra time overhead required to process the additional bits generated by the ECC can be significant. In smaller devices, the additional ECC area consumed on the device can easily exceed the size of the memory cells themselves by a significant amount.

This invention addresses the shortcomings of the prior art.

SUMMARY OF INVENTION

The invention provides an SEU tolerant SRAM bit cell for either six-transistor (6T), eight-transistor (8T), or multi-port RAM cell configurations fabricated in accordance with 0.18 μm or smaller CMOS processes. SEU tolerance is achieved without significantly increasing the cell's read and write cycle time and negligible impact on cell stability.

Figure 2A:
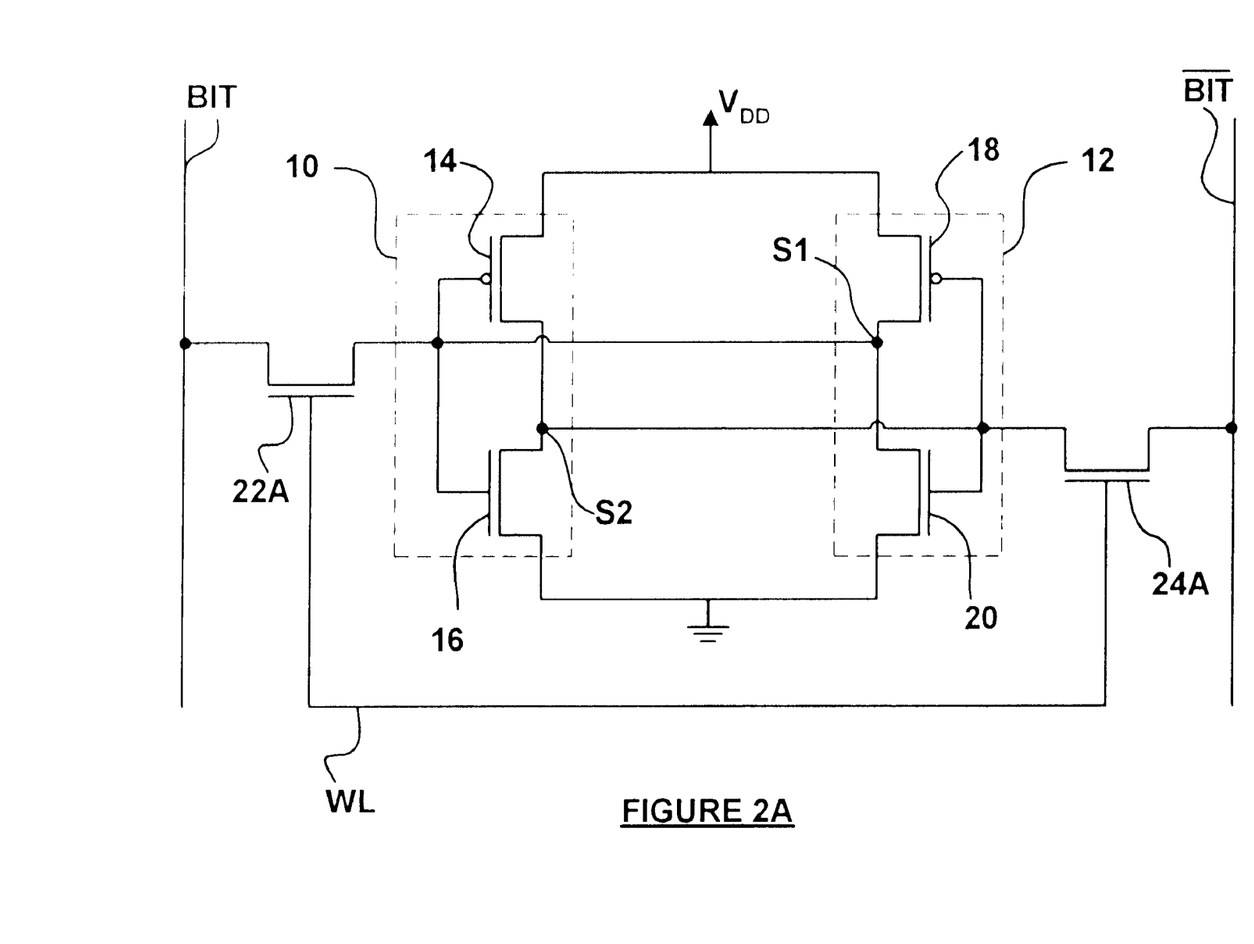
FIG. 2A is a circuit schematic diagram of an SEU tolerant 6T SRAM bit cell in accordance with a first embodiment of the invention.
Figure 2B:
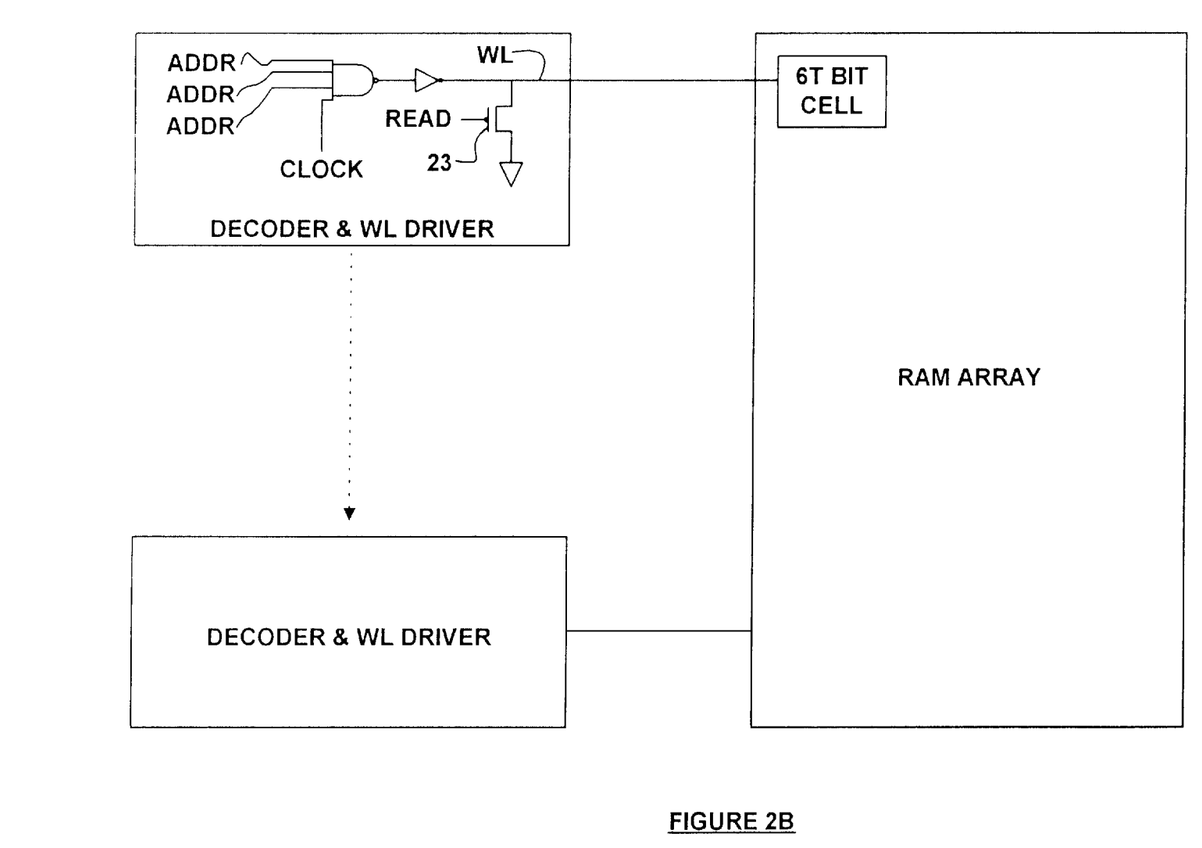
FIG. 2B schematically depicts a 3-level word line decoder for use with the 6T SRAM bit cell of FIG. 2A.

In the FIG. 2A 6T embodiment, the bit cell's NFET pass transistors and PFET pull-up transistors are increased in size (without increasing the size of the pull-down transistors) to achieve a reasonable write margin, and one of three logic/voltage levels are used to address the cell with the aid of the FIG. 2B tri-level word line decoder for each row in the RAM. A high voltage level is used to write data into the cell, a medium voltage level (which yields an acceptable read margin) is used to read data from the cell, and a low voltage level is used if the cell is not being accessed.

Figure 3:
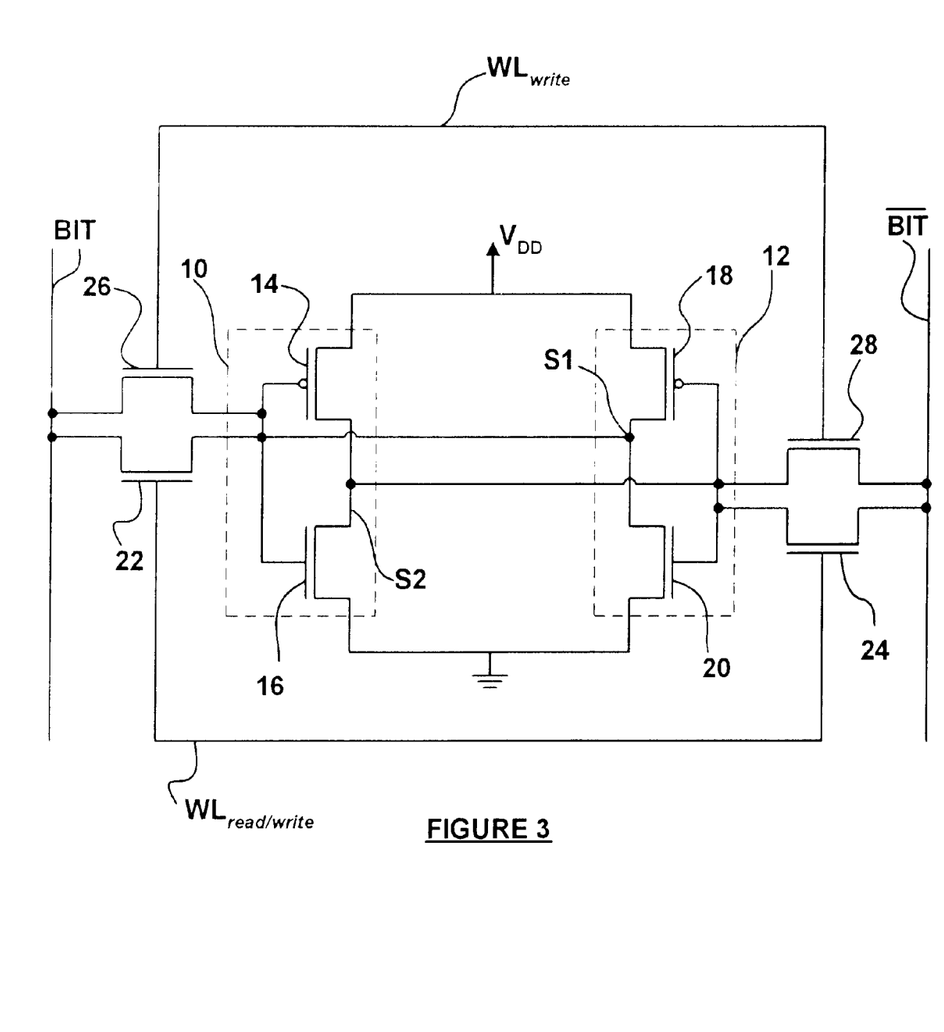
FIG. 3 is a circuit schematic diagram of an SEU tolerant 8T SRAM bit cell in accordance with a second embodiment of the invention.

In the FIG. 3 8T embodiment, the desired (predefined) write margin is achieved by increasing the size of the bit cell's PFET pull-up transistors, again without increasing the size of the pull-down transistors; and, by providing a parallel pair of NFET pass transistors for each one of the cell's two inverters. The additional NFET pass transistors are sized such that if both pass transistors are on, the cell has the desired write margin; and, if only one pass transistor is on each side of the cell, the read margin is within acceptable limits. Two word lines are provided for each bit cell row: one for writing data into the cell and another for use during both writing and reading operations.

Figure 4:
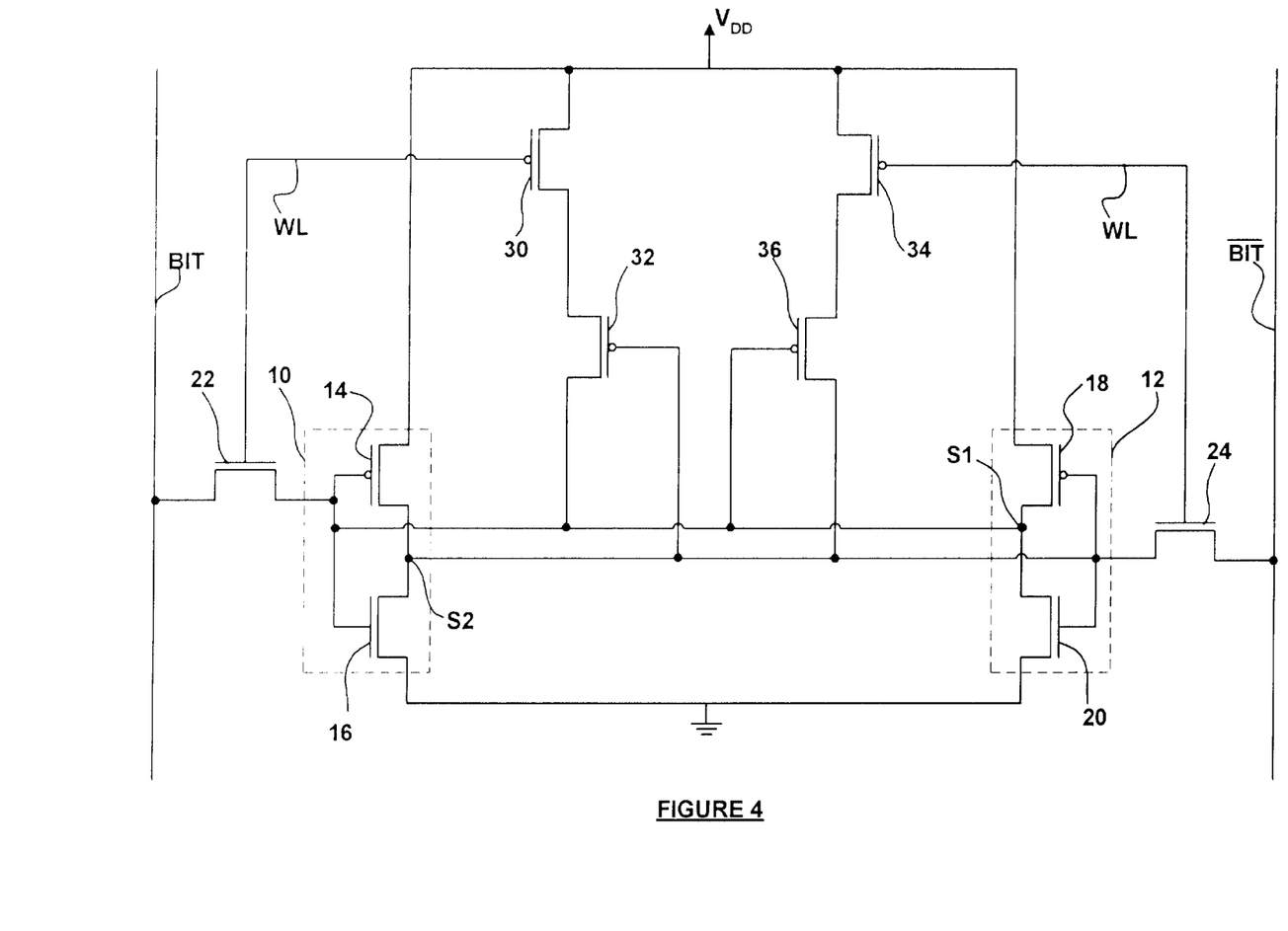
FIG. 4 is a circuit schematic diagram of an SEU tolerant 10T SRAM bit cell in accordance with a third embodiment of the invention.

The FIG. 4 10T embodiment increases the capability of the cell's PFET pull-up transistors to inject current into the cell's storage nodes (S1, S2) whenever read or write operations are not being performed. This is achieved by associating a parallel pair of PFET pull-up transistors 14, 36 with node S2 and associating another parallel pair of PFET pull-up transistors 18, 32 with node S1. Additional circuitry ensures that the extra PFET pull-up transistors are turned on if data is not being written into their respective associated storage nodes and if that node is in a logic high state; otherwise, the extra PFET pull-up-transistors are turned off. PFET pull-up transistors 14, 18 are sized to ensure reasonable write and read margins, and the extra transistors 30, 32, 34, 36 are sized to provide soft-error protection when the cell is not being accessed.

Figure 5A:
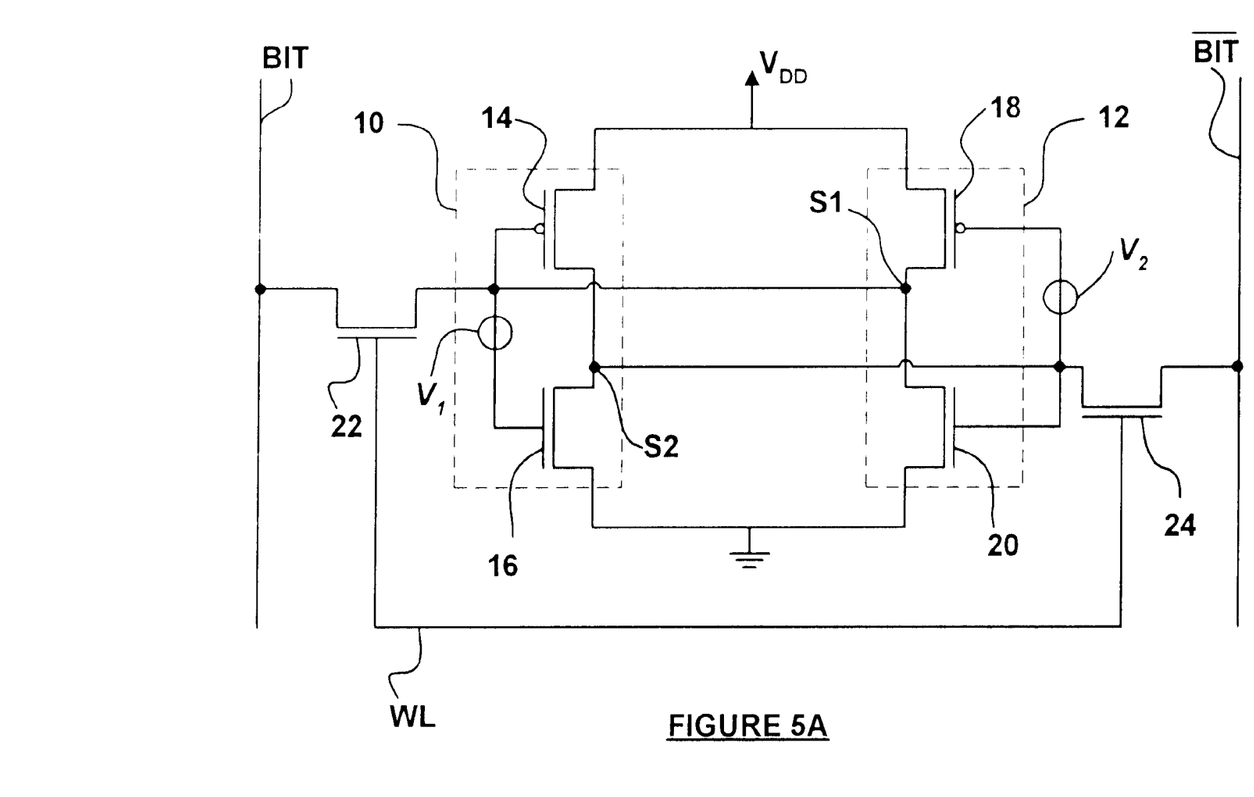
FIGS. 5A and 5B are circuit schematic diagrams of SEU tolerant 6T and 8T SRAM bit cells in accordance with a fourth embodiment of the invention

In the FIG. 5A 6T embodiment, the bit cell's PFET pull-up transistors are increased in size to achieve a reasonable write margin and those transistors' gate voltages are controllably varied during write operations. Specifically, if the storage node associated with the PFET pull-up transistor is in the logic low state, a logic high gate voltage is applied to that transistor. If the associated storage node is in the logic high state and if data is not being written into the bit cell, the gate voltage is held near ground potential. If the associated storage node is in the logic high state and if data is being written into the bit cell, the gate voltage is maintained at a voltage which yields the appropriate write margin. The FIG. 5B 8T embodiment illustrates gate voltage control during write operations.

DESCRIPTION

As is well known, an SRAM bit cell can be represented by:

$$Q_{critical}=C_{node}*V_{DD}+Id_{sat}*t_{flip} \quad (1)$$

where $Q_{critical}$ is the minimum electrical charge required to change the cell's logic state; $C_{node}$ is the cumulative capacitance of either one of the cell's two storage nodes S1, S2; $V_{DD}$ is the magnitude of the logic high voltage signal; $Id_{sat}$ is the saturation current of the pull-up PFET or pull-down NFET which restores the storage node voltage; and $t_{flip}$ is the time required to "flip" the cell's logic state from high to low or vice versa during writing of a data bit into the cell.

In general, an α-particle strike to the drain of an "off" PFET or NFET in an SRAM bit cell can induce a current (depending on the magnitude of the voltage at the drain) which, if sufficiently large in magnitude and of sufficiently long duration, may flip the cell's logic state, resulting in an SEU effect. More particularly, an SEU effect occurs if the α-particle strike-induced current is sufficiently large in magnitude to discharge the charge stored on the storage node associated with the α-particle stricken transistor and also overcome the charge-restoring effect of that node's pull-up PFET or pull-down NFET. This induced current can be modelled as a charge, $Q_α$, by integrating the current's value over time (from t=0 when the α-particle strikes, to $t=t_{flip}$). To produce an SRAM bit cell which is not susceptible to SEU effects one must ensure that $Q_{critical}>Q_α$, where $Q_α$ is dependent upon factors such as the fabrication process used to construct the bit cell, the supply voltage, and the mobility of the carriers (electrons for NFETS, denoted $Q_{αn}$; and holes for PFETS, denoted $Q_{αp}$).

Figure 1:
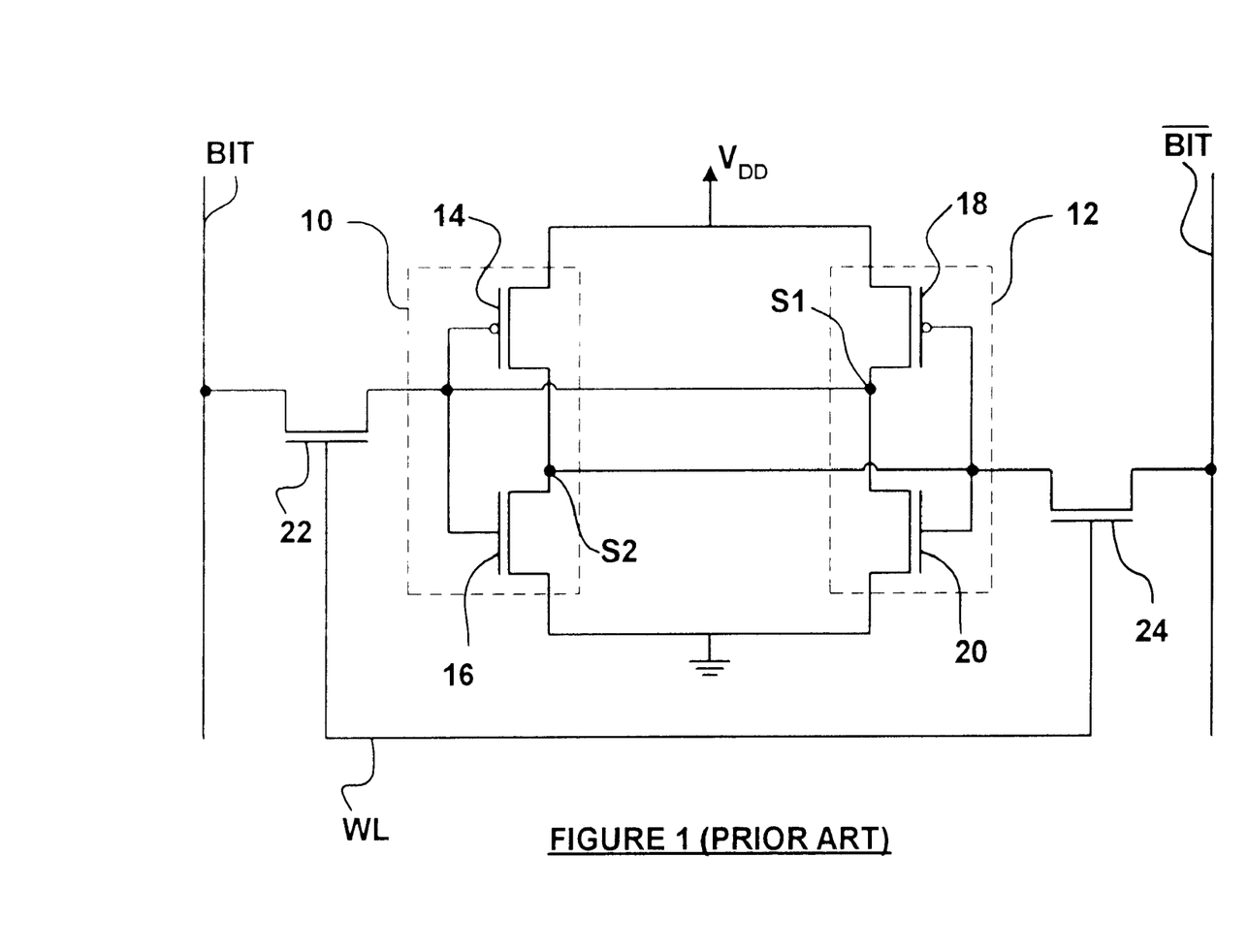
FIG. 1 is a circuit schematic diagram of a prior art 6T SRAM bit cell.

FIG. 1 depicts a typical 6T prior art CMOS SRAM single bit memory cell ("bit cell") incorporating cross-coupled inverters 10, 12. Inverter 10 is formed by PFET pull-up transistor 14 and NFET pull-down transistor 16. PFET 14's source is connected to a logic "high" voltage reference ($V_{DD}$), PFET 14's drain is connected in series with NFET 16's drain, NFET 16's source is connected to a logic "low" voltage reference (ground), and PFET 14's gate is connected to NFET 16's gate. Inverter 12 is formed by PFET pull-up transistor 18 and NFET pull-down transistor 20. PFET 18's source is connected to $V_{DD}$, PFET 18's drain is connected in series with NFET 20's drain, NFET 20's source is connected to ground, and PFET 18's gate is connected to NFET 20's gate. Inverters 10, 12 are cross-coupled by connecting the gates of PFET 14 and NFET 16 to the drains of PFET 18 and NFET 20 to define a first storage node S1; and, by connecting the gates of PFET 18 and NFET 20 to the drains of PFET 14 and NFET 16 to define a second storage node S2. The source-to-drain path of NFET pass transistor 22 is connected between first storage node S1 and first bit line BIT, and the gate of NFET 22 is connected to word line WL. The source-to-drain path of NFET pass transistor 24 is connected between second storage node S2 and second bit line $\overline{BIT}$, and the gate of NFET 22 is connected to word line WL.

Pass transistors 22, 24 are selectively turned on or off via word line WL to read or write data from the bit cell via bit lines BIT, $\overline{BIT}$. The cross-coupled structure of inverters 10, 12 ensures that logically opposite voltages are always maintained at first and second storage nodes S1, S2 respectively. To read the single bit value stored in the bit cell, a logic high voltage signal is applied to word line WL, turning pass transistors 22, 24 on, thereby coupling nodes S1, S2 to bit lines BIT, $\overline{\text{BIT}}$ respectively and allowing the bit cell to apply a differential voltage signal to bit lines BIT, $\overline{\text{BIT}}$ which is in turn amplified by sense amplifiers (not shown). The sizes of transistors 14 through 24 are selected to accommodate writing of a single bit value into the bit cell by either pulling bit line $_{BIT}$ and node S1 low to drive node S2 high; or, pulling bit line $_{\overline{BIT}}$ and node S2 low to drive node S1 high when pass transistors 22, 24 are turned on. The cross coupled inverters latch the new data.

In order to increase the $Q_{critical}$ value of the FIG. 1 bit cell without adversely affecting the cell's read margin, a typical designer would begin by increasing the drawn width/length (W/L) ratio of NFET pull-down transistors 16, 20 and NFET pass transistors 22, 24; taking care not to excessively shorten those transistors. For example, undue shortening of the pass transistors can increase the cell's leakage current which can in turn cause read problems. On a large SRAM device incorporating many bit cells the cumulative leakage current of the device's inactive cells may approximate the active cell's read current, thus decreasing the differential voltage at which the cell is read. This has an adverse effect on the robustness of the device and on production yields. The typical designer would then increase the W/L ratio of each of PFET pull-up transistors 14, 18 to further increase the cell's $Q_{critical}$ value and thereby reduce the cell's susceptibility to SEU effects. In most cases, this approach undesirably reduces the cell's write margin because the enlarged pull-up transistors are too strong relative to the pass transistors. If the pass transistors are enlarged to compensate, the cell's read margin is undesirably reduced unless the pull-down transistors are further enlarged until both reasonable read and write margins are attained. This approach can result in high performance cell, but at the expense of significantly increasing the size of the cell, which is preferably minimized.

The first embodiment of the invention (FIG. 2A) provides an area and performance efficient solution to the problem. Components which are common to the FIG. 1 prior art circuit and to the FIG. 2A embodiment bear the same reference numerals in both Figures. NFET pass transistors 22A, 24A and PFET pull-up transistors 14, 18 are enlarged (i.e. their respective W/L ratios are increased-without increasing the W/L ratios of pull-down transistors 16, 20) until a predetermined write margin is attained (i.e. the cell will function reliably, even if produced in accordance with worst case corner process parameters). One of three different logic/voltage levels are then applied to word line WL in order to address the cell. Specifically, a logic high voltage signal is applied to word line WL to write data into the cell; a medium voltage signal (i.e. a voltage between the logic high and logic low voltage signals) is applied to word line WL to read data from the cell; and, a logic low voltage signal is applied to word line WL if no read or write operation is being performed on the cell. This requires a 3-level decoder and word line driver for each row in the RAM array, as shown in FIG. 2B. During a read operation, PFET pull-down transistor 23 is turned on, producing a small voltage drop on word line WL. Consequently, the bit cell's pass transistors are partially but not fully turned on during read operations, thus protecting the bit cell's read margin. The bit cell's transistors are sized such that the aforementioned voltage drop on word line WL is about 10% of the power supply voltage. During performance of a write operation no voltage drop is produced on word line WL. Consequently, the bit cell's pass transistors are fully turned on during write operations, thus maintaining the desired write margin.

The second embodiment of the invention is illustrated in FIG. 3. Components which are common to the FIG. 1 prior art circuit and to the FIG. 3 embodiment bear the same reference numerals in both Figures, excepting the word line which is labelled $WL_{read/write}$ in FIG. 3. PFET pull-up transistors 14, 18 are enlarged (i.e. their respective W/L ratios are increased-without increasing the W/L ratios of pull-down transistors 16, 20) until a predetermined write margin is attained. Unlike the prior art, the FIG. 3 embodiment includes an additional NFET pass transistor 26 in parallel with NFET pass transistor 22, between first storage node S1 and first bit line $_{BIT}$. The gate of NFET 26 is connected to a second write-only word line $WL_{write}$. An additional NFET pass transistor 28 is also provided, in parallel with NFET pass transistor 24, between first storage node S2 and second bit line $_{\overline{BIT}}$. The gate of NFET 28 is connected to write-only word line $WL_{write}$. A read operation is performed by applying a logic high voltage signal to read/write word line $WL_{read/write}$, turning pass transistors 22, 24 on without affecting pass transistors 26, 28. A write operation is performed by applying a logic high voltage signal to both read/write word line $WL_{read/write}$ and to write-only word line $WL_{write}$, turning pass transistors 22, 24 26, 28 on.

NFETs 26, 28 are sized such that when NFETs 22, 26, 24, 28 are turned on (i.e. during a write operation), the cell's write margin is within predetermined limits (i.e. the cell will function reliably, even if produced in accordance with worst case corner process parameters); and, such that when only NFETs 22 and 24 are turned on (i.e. during a read operation), the cell's read margin is similarly within predetermined limits.

Figure 6:
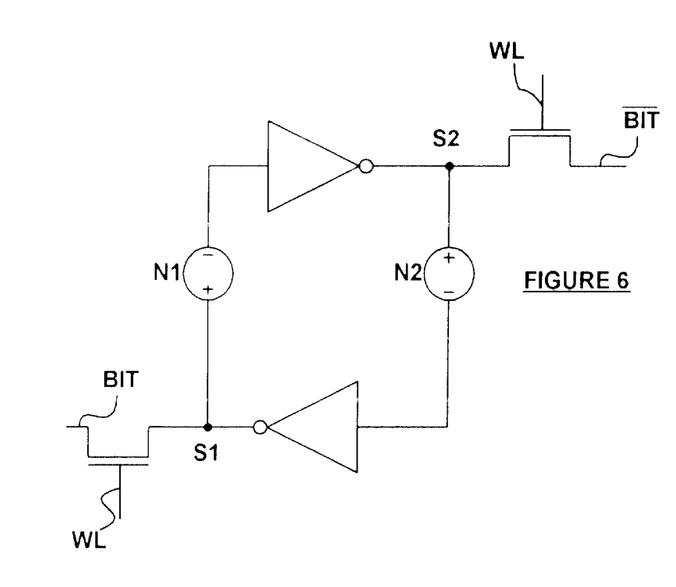
FIG. 6 is a circuit schematic diagram of a test configuration for simulating and selecting SRAM bit cell read margin.

SRAM cell write and read margins are not fixed absolutes-the designer must trade off performance and robustness requirements to select margins which are suitable for a particular application. FIG. 6 depicts a test configuration for SPICE simulation and selection of a cell's read margin. Two so-called noise voltage sources N1, N2 are inserted in the cell, as shown. The cell is initialised such that node S1 is at ground potential and the voltage at node S2 equals $V_{DD}$. The $V_{DD}$ voltage is also applied to bit lines BIT, $\overline{\text{BIT}}$ and to word line WL. The voltages output by noise voltage sources N1, N2 are then increased until the cell flips (i.e. the cell's logic state changes). The voltage at which the cell flips is called the "read noise margin" or simply "read margin".

Figure 7:
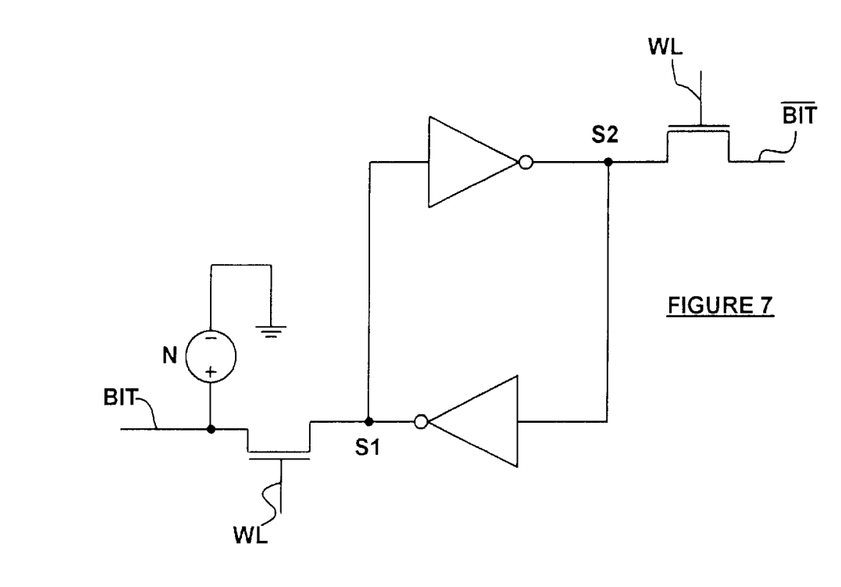
FIG. 7 is a circuit schematic diagram of a test configuration for simulating and selecting SRAM bit cell write margin.

FIG. 7 depicts a test configuration for SPICE simulation and selection of a cell's write margin. Bit line $_{\overline{BIT}}$ is connected to a $V_{DD}$-driven NFET transistor (not shown) which is at least 100 times larger than the simulation cell's NFET pass transistor. A variable voltage source N is connected to bit line $_{BIT}$. The circuit is initialised such that the voltage at node S1 equals $V_{DD}$ and node S2 is at ground potential. Word line WL is then activated by applying the $V_{DD}$ voltage to WL. The voltage output by voltage source N is then decreased until the cell flips. The voltage at which the cell flips is called the "write noise margin" or simply "write margin". The cell is sized such that both read and write margins are kept positive using SPICE "extended 6 sigma" defect rate prevention process files.

The third embodiment of the invention is illustrated in. FIG. 4. Components which are common to the FIG. 1 prior art circuit and to the FIG. 4 embodiment bear the same reference numerals in both Figures. Unlike the prior art, the FIG. 4 embodiment includes an additional PFET pull-up transistor 32 in parallel with PFET pull-up transistor 14. More particularly, PFET 32's source is connected to the logic "high" voltage reference ($V_{DD}$), through series-connected PFET 30. PFET 30's gate is connected to word line WL. An additional PFET pull-up transistor 36 is connected in parallel with PFET pull-up transistor 18. PFET 36's source is connected to the logic "high" voltage reference ($V_{DD}$) through series-connected PFET 34. PFET 32's gate is connected to word line WL. PFET 32's drain is connected to storage node S1, and PFET 32's gate is connected to storage node S2. PFET 36's drain is connected to storage node S2, and PFET 36's gate is connected to storage node S1.

PFET 32 ensures that if storage node S1 is in a logic "high" state and if no read or write operation is being performed (i.e. a logic "low" voltage is applied to word line WL turning PFET 30 on) then PFET 32's $Id_{sat}$ maintains the charge at storage node S1. Similarly, PFET 36 ensures that if storage node S2 is in a logic "high" state and if no read/write operation is being performed (i.e. a logic "low" voltage is applied to word line WL turning PFET 34 on) then PFET 36's $Id_{sat}$ maintains the charge at storage node S2. During read or write operations, a logic "high" voltage is applied to word line WL to turn PFETs 30, 32 off thereby disconnecting the additional PFET pull-up transistors 30, 32, 34, 36 from storage nodes S1, S2 respectively and maintaining the bit cell's read and write margins.

The time during which a typical SRAM bit cell undergoes read or write operations is very short in comparison to the time the bit cell stores data without undergoing and read or write operation. Most α-particle strikes occur during such data storage time intervals. The FIG. 4 embodiment of the invention increases the bit cell's $Q_{critical}$ value by increasing the effective $Id_{sat}$ pull-up capability of inverters 10, 12 respectively in the absence of read or write activity.

Figure 5B:
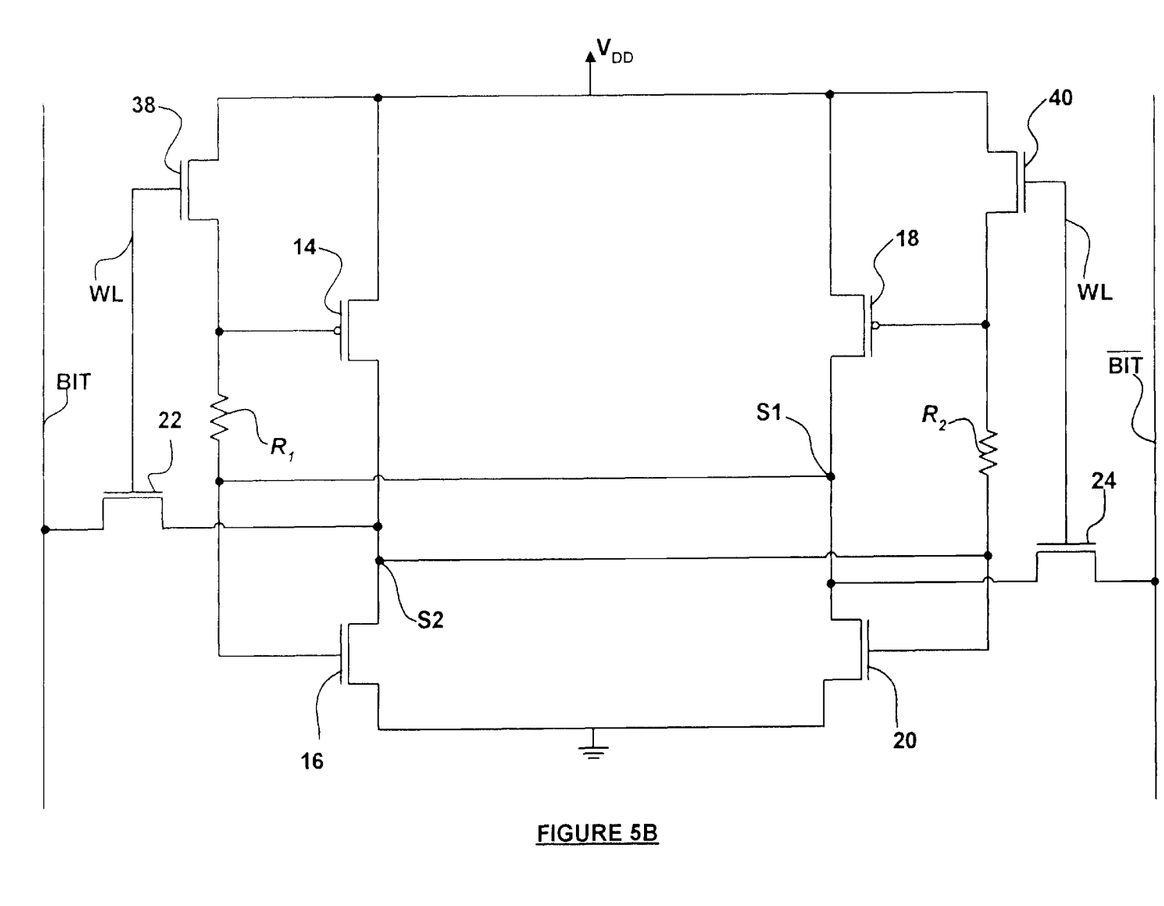

The fourth embodiment of the invention is illustrated in FIGS. 5A and 5B. Components which are common to the FIG. 1 prior art circuit and to the FIG. 5A embodiment bear the same reference numerals in both Figures. Unlike the prior art, the FIG. 5A embodiment includes a first state-dependent, write-dependent voltage source $V_1$ connected in series between the gates of PFET pull-up transistor 14 and NFET pull-down transistor 16; and, a second state-dependent, write-dependent voltage source $V_2$ connected in series between the gates of PFET pull-up transistor 18 and NFET pull-down transistor 20. State and write dependency means that the $V_1$, $V_2$ voltage values are dependent on whether the corresponding nodes S1, S2 store "one" or "zero" values; and, are further dependent on whether or not a write operation occurs. Specifically, the $V_1$, $V_2$ voltage values are high when a write operation occurs; the V, voltage value is high when the voltage value at node S2 is low; the $V_2$ voltage value is high when the voltage value at node S1 is low; and, the $V_1$, $V_2$ voltage values are low in all other cases.

Voltage source $V_1$ varies the voltage applied to PFET 14's gate such that if storage node S1 is in a logic "low" state, a voltage equal to the logic "high" voltage reference ($V_{DD}$) is applied to PFET 14's gate. However, if storage node S1 is in a logic "high" state and if no write operation is being performed, then a logic low voltage is applied to PFET 14's gate; whereas, if a write operation is being performed, then a voltage which maintains the cell's write margin is applied to PFET 14's gate. The applied voltage is dependent on the power supply voltage ($V_{DD}$), and on the worst case corner parameters which characterize the integrated circuit fabrication process. The applied voltage value is selected to minimize device manufacturing costs and integrated circuit area requirements while maintaining a predetermined write margin.

Voltage source $V_2$ similarly varies the voltage applied to PFET 18's gate such that if storage node S2 is in a logic "low" state, a voltage equal to the logic "high" voltage reference ($V_{DD}$) is applied to PFET 18's gate. However, if storage node S2 is in a logic "high" state and if no write operation is being performed, then a voltage near ground potential is applied to PFET 18's gate; whereas, if a write operation is being performed, then a voltage which maintains the cell's write margin within acceptable limits is applied to PFET 18's gate.

If voltage sources $V_1$, $V_2$ are implemented by means of transistors or other active devices, care must be taken to ensure that storage nodes S1, S2 each have sufficient $Q_{critical}$ values. As previously explained, the susceptibility to SEU effects of a 6T SRAM bit cell like that of FIG. 1 can be reduced by increasing the drive strength of PFET pull-up transistors 14, 18 enabling them to supply enough current to overcome any charge buildup due to an α-particle strike. But if only PFETs 14, 18 are enlarged, the cell's write margin is significantly negatively impacted which is undesirable since during a write operation NFET pass transistors 22, 24 must overcome the effect of the increased drive strength pull-up transistors in order to change of the cell's logic state. This problem is solved by having state dependent voltage sources $V_1$, $V_2$ vary the PFETs gate voltages during write operations, as previously explained.

Components which are common to the FIG. 1 prior art circuit and to the FIG. 5B embodiment bear the same reference numerals in both Figures. Unlike the prior art, the FIG. 5B embodiment includes an additional NFET pull-up transistor 38 in parallel with PFET pull-up transistor 14. More particularly, NFET 38's drain is connected to the logic "high" voltage reference ($V_{DD}$), NFET 38's source is connected to pull-up PFET 14's gate and (through pull-up resistor $R_1$) to pull-down NFET 16's gate, and NFET 38's gate is connected to word line WL. An additional NFET pull-up transistor 40 is connected in parallel with PFET pull-up transistor 18. NFET 40's drain is connected to the logic "high" voltage reference ($V_{DD}$), NFET 40's source is connected to pull-up PFET 18's gate and (through pull-up resistor $R_2$) to pull-down NFET 20's gate, and NFET 40's gate is connected to word line WL.

When WL is inactive (i.e. if no read or write operation is underway) the voltage applied to PFET 14's gate is equal to the voltage at storage node S1, as in the case of the FIG. 1 prior art circuit. When WL is active (i.e. if either a read or a write operation is underway) the voltage applied to PFET 14's gate is pulled to a higher value by NFET 38, thus decreasing PFET 14's gate-source voltage, thereby effectively reducing PFET 14's drive capability. This in turn enables the lower drive strength NFET pass transistor 22 to change the cell's logic state during a write operation without adversely affecting the cell's write margin. NFET 40 attains the same effect with respect to NFET 24, and PFET 18 during writing of storage node S2. The voltage at PFET 14's gate is determined by the strength of NFET 38 versus that of resistor $R_1$ and NFET 20. The voltage at PFET 18's gate is determined by the strength of NFET 40 versus that of resistor $R_2$ and NFET 16.

Simulations have revealed that it is feasible to achieve good results with very small NFET pull-up transistors 38, 40 and pull-up resistors $R_1$, $R_2$.

Simulations and layout experiments implementing the above-described techniques reveal that a single-port SRAM bit cell produced by a 0.13 μm CMOS process is larger than a optimized non-SEU tolerant prior art bit cell yet smaller than an SEU tolerant cell produced solely by increasing the cell's size without also taking into account the additional factors described above in relation to the invention.

Although the $Q_{critical}$ of a dual or multi-port memory cell is usually larger than that of a similar single-port memory produced by the same fabrication process, the $Q_{critical}$ of a multi-port memory cell produced by a deep sub-micron process may nevertheless be small enough to render the cell susceptible to significant α-particle strike-induced SEU effects. The above-described techniques can also be used to produce multi-port memory cells having reduced susceptibility to such effects. The only adaptation necessary for multi-port memories is the definition of read margin and pass gates for extra ports: the cell's worst case read margin should be measured when all ports perform a read operation simultaneously, (as opposed to the definition of write margin which involves a write operation at only one port). To provide the required read margin, the NFET pull-down transistor is effectively doubled in size in comparison to the size of the NFET pull-down transistor in an otherwise corresponding single port bit cell.

As will be apparent to those skilled in the art in the light of the foregoing disclosure, many alterations and modifications are possible in the practice of this invention without departing from the spirit or scope thereof. For example, instead of providing two parallel NFET pass transistors as in the FIG. 3 embodiment, one could provide three or more such transistors to attain the same objective. Similarly, instead of providing two parallel PFET pull-up transistors as in the FIG. 4 embodiment, one could provide three or more such transistors to attain the same objective. As a further alternative, one could combine the state-dependent, voltage source embodiment of FIG. 5A With any of the embodiments of FIGS. 2–4 or 5B; or, combine the FIG. 5B parallel pull-up NFET transistor and pull-up resistor embodiment with any of the embodiments of FIGS. 2–4 to attain the same objectives. One may also use the above-described techniques of the present invention in combination with prior art techniques such as the aforementioned techniques of adding resistance and/or capacitance to further improve SEU tolerance of SRAM bit calls. Accordingly, the scope of the invention is to be construed in accordance with the substance defined by the following claims.

What is claimed is:

1. A method of reducing susceptibility of a memory bit cell to single event upset effects, said bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said pass transistors further coupled to a word line for controllably switching said pass transistors on or off, each one of said transistors having a drawn width to drawn length W/L ratio, said method comprising:

(a) increasing said W/L ratio for each one of said pull-up transistors and for each one of said pass transistors, without increasing said W/L ratio for said pull-down transistors, until said bit cell has a selected write margin value;

(b) applying a first logic signal to said word line while writing data into said bit cell, said first logic signal turning said pass transistors fully on during said writing;

(c) applying a second logic signal to said word line while reading data from said bit cell, said second logic signal turning said pass transistors partially but not fully on during said reading; and, (d) applying a third logic signal to said word line while neither writing data into said bit cell nor reading data from said bit cell, said third logic signal turning said pass transistors off.

2. A multiple-row and multiple-column memory array comprising a plurality of bit cells, each one of said bit cells further comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said pass transistors further coupled to a word line for controllably switching said pass transistors on or off, said memory array further comprising for each one of said rows a driver for applying to said word line of all of said bits cells in said row:

(a) a first logic signal for signal turning said pass transistors fully on while writing data into said bit cell;

(b) a second logic signal for turning said pass transistors partially but not fully on while reading data from said bit cell; and, (c) a third logic signal for turning said pass transistors off while neither writing data into said bit cell nor reading data from said bit cell.

3. A memory array as defined in claim 2, wherein said pull-up transistors are PMOS transistors, and said pull-down transistors and said pass transistors are NMOS transistors.

4. A memory array as defined in claim 3, wherein said first logic signal is a logic high voltage reference signal, said third logic signal is a logic low voltage reference signal, said second logic signal is a voltage between said high and said low voltage reference signals, said series-connected terminals further comprise drain terminals of said respective inverter pull-up and pull-down transistors, said logic high voltage reference signal is applied to a source terminal of each one of said pull-up transistors, said logic low voltage reference signal is applied to a source terminal of each one of said pull-down transistors, a switching terminal of said first inverter pull-up transistor is coupled to a switching terminal of said first inverter pull-down transistor, a switching terminal of said second inverter pull-up transistor is coupled to a switching terminal of said second inverter pull-down transistor, said first inverter pull-up and pull-down transistor switching terminals are further coupled to said second inverter series-connected terminals, said second inverter pull-up and pull-down transistor switching terminals are further coupled to said first inverter series-connected terminals, a source-to-drain path of said first pass transistor is coupled between said first bit line and said first storage node, a source-to-drain path of said second pass transistor is coupled between said second bit line and said second storage node, and a switching terminal of said first pass transistor is coupled to a switching terminal of said second pass transistor.

5. A method of reducing susceptibility of a memory bit cell to single event upset effects, said bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said first and second pass transistors further coupled to a first word line for controllably switching said first and second pass transistors on or off, each one of said transistors having a drawn width to drawn length W/L ratio, said method comprising:

(a) increasing said W/L ratio for each one of said pull-up transistors, without increasing said W/L ratio for said pull-down transistors, until said bit cell has a selected write margin value;

(b) coupling a third pass transistor in parallel with said first pass transistor and between said first bit line and said first one of said storage nodes;

(c) coupling a fourth pass transistor in parallel with: said second pass transistor and between said second bit line and said second one of said storage nodes;

(d) further coupling said third and fourth pass transistors to a second word line for controllably switching said third and fourth pass transistors on or off;

(e) applying a first logic signal to said first word line and to said second word line while writing data into said bit cell, said first logic signal turning said first, second, third and fourth pass transistors on during said writing; and, (f) applying said first logic signal to said first word line and applying a second logic signal to said second word line while reading data from said bit cell, said first logic signal turning said first and second pass transistors on during said reading and said second logic signal turning said third and fourth pass transistors off during said reading.

6. A method as defined in claim 5, further comprising increasing said W/L ratio for each one of said third and fourth pass transistors until:

(i) said bit cell has a selected write margin value whenever said first, second, third and fourth pass transistors are turned on; and, (ii) said bit cell has a selected read margin value whenever said first and second pass transistors are turned on, and said third and fourth pass transistors are turned off.

7. A method of reducing susceptibility of a memory bit cell to single event upset effects, said bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said pass transistors further coupled to a word line for controllably switching said pass transistors on or off, said method comprising:

(a) coupling a third pull-up transistor in parallel with said first inverter pull-up transistor, said third pull-up transistor having a terminal connected to said first inverter storage node;

(b) coupling a first switching transistor in series with said third pull-up transistor, said first switching transistor further coupled to said word line to controllably switch said first switching transistor on or off;

(c) coupling a fourth pull-up transistor in parallel with said second inverter pull-up transistor, said fourth pull-up transistor having a terminal connected to said second inverter storage node; and, (d) coupling a second switching transistor in series with said fourth pull-up transistor, said second switching transistor further coupled to said word line to controllably switch said second switching transistor on or off.

8. A memory bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said first and second pass transistors further coupled to a word line for controllably switching said first and second pass transistors on or off, a third pull-up transistor coupled in parallel with said first inverter pull-up transistor, said third pull-up transistor having a terminal connected to said first inverter storage node, a first switching transistor coupled in series with said third pull-up transistor, said first switching transistor further coupled to said word line to controllably switch said first switching transistor on or off, a fourth pull-up transistor coupled in parallel with said second inverter pull-up transistor, said fourth pull-up transistor having a terminal connected to said second inverter storage node, and a second switching transistor coupled in series with said fourth pull-up transistor, said second switching transistor further coupled to said word line to controllably switch said second switching transistor on or off.

9. A bit cell as defined in claim 8, wherein said pull-up transistors and said switching transistors are PMOS transistors, and said pull-down transistors and said pass transistors are NMOS transistors.

10. A bit cell as defined in claim 9, wherein said series-connected terminals further comprise drain terminals of said respective inverter pull-up and pull-down transistors, a logic high voltage reference signal is applied to a source terminal of each one of said first and second inverter pull-up transistors, a logic low voltage reference signal is applied to a source terminal of each one of said first and second inverter pull-down transistors, a switching terminal of said first inverter pull-up transistor is coupled to a switching terminal of said first inverter pull-down transistor, a switching terminal of said second inverter pull-up transistor is coupled to a switching terminal of said second inverter pull-down transistor, said first inverter pull-up and pull-down transistor switching terminals are further coupled to said second inverter series-connected terminals, said second inverter pull-up and pull-down transistor switching terminals are further coupled to said first inverter series-connected terminals, a source-to-drain path of said first pass transistor is coupled between said first bit line and said first storage node, a source-to-drain path of said second pass transistor is coupled between said second bit line and said second storage node, a source-to-drain path of said first switching transistor is coupled between said logic high voltage reference signal and said third pull-up transistor, a source-to-drain path of said second switching transistor is coupled between said logic high voltage reference signal and said fourth pull-up transistor, a source-to-drain path of said third pull-up transistor is coupled between said first switching transistor and said first storage node, a source-to-drain path of said fourth pull-up transistor is coupled between said second switching transistor and said second storage node, a switching terminal of said third pull-up transistor is coupled to said second storage node, a switching terminal of said fourth pull-up transistor is coupled to said first storage node, a switching terminal of said first pass transistor is coupled to a switching terminal of said first switching transistor, and a switching terminal of said second pass transistor is coupled to a switching terminal of said second switching transistor.

11. A method of reducing susceptibility of a memory bit cell to single event upset effects, said bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said pass transistors further coupled to a word line for controllably switching said pass transistors on or off, said method comprising:

(a) while said first inverter storage node is in a logic low state, applying a logic high signal to a switching terminal of said second inverter pull-up transistor;

(b) while said first inverter storage node is in a logic high state and while not writing data into said bit cell, applying a logic low signal to said switching terminal of said second inverter pull-up transistor;

(c) while said first inverter storage node is in a logic high state and while writing data into said bit cell, applying to said switching terminal of said second inverter pull-up transistor a voltage which maintains a selected write margin value for said cell;

(d) while said second inverter storage node is in a logic low state, applying a logic high signal to a switching terminal of said first inverter pull-up transistor;

(e) while said second inverter storage node is in a logic high state and while not writing data into said bit cell, applying a logic low signal to said switching terminal of said first inverter pull-up transistor; and, (f) while said second inverter storage node is in a logic high state and while writing data into said bit cell, applying to said switching terminal of said first inverter pull-up transistor a voltage which maintains said selected write margin value for said cell.

12. A memory bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said first and second pass transistors further coupled to a word line for controllably switching said first and second pass transistors on or off, a first variable voltage source coupled between switching terminals of said first inverter pull-up and pull-down transistors, and a second variable voltage source coupled between switching terminals of said second inverter pull-up and pull-down transistors.

13. A bit cell as defined in claim 12, wherein said pull-up transistors are PMOS transistors, and said pull-down transistors and said pass transistors are NMOS transistors.

14. A bit cell as defined in claim 13, wherein said series-connected terminals further comprise drain terminals of said respective inverter pull-up and pull-down transistors, a logic high voltage reference signal is applied to a source terminal of each one of said pull-up transistors, a logic low voltage reference signal is applied to a source terminal of each one of said pull-down transistors, said first inverter pull-up and pull-down transistor switching terminals are further coupled to said second inverter series-connected terminals, said second inverter pull-up and pull-down transistor switching terminals are further coupled to said first inverter series-connected terminals, a source-to-drain path of said first pass transistor is coupled between said first bit line and said first storage node, a source-to-drain path of said second pass transistor is coupled between said second bit line and said second storage node, and a switching terminal of said first pass transistor is coupled to a switching terminal of said second pass transistor.

15. Apparatus as defined in claim 14, wherein said first and second voltage sources are state-dependent and write-dependent.

16. A method of reducing susceptibility of a memory bit cell to single event upset effects, said bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said pass transistors further coupled to a word line for controllably switching said pass transistors on or off, said method comprising:

(a) coupling a third pull-up transistor in parallel with said first inverter pull-up transistor, said third pull-up transistor having a switching terminal coupled to said word line to controllably switch said third pull-up transistor on or off;

(b) coupling a drain-to-source path of said third pull-up transistor through a first resistor to a switching terminal of said first inverter pull-down transistor;

(c) coupling a fourth pull-up transistor in parallel with said second inverter pull-up transistor, said fourth pull-up transistor having a switching terminal coupled to said word line to controllably switch said fourth pull-up transistor on or off;

(d) coupling a drain-to-source of said fourth pull-up transistor through a second resistor to a switching terminal of said second inverter pull-down transistor;

(e) applying a first logic signal to said word line while neither writing data into said bit cell nor reading data from said bit cell, said first logic signal turning said third and fourth pull-up transistors off, thereby maintaining said second inverter storage node at a voltage equal to the voltage at a switching terminal of said first inverter pull-up transistor and maintaining said first inverter storage node at a voltage equal to the voltage at a switching terminal of said second inverter pull-up transistor; and, (f) applying a second logic signal to said word line while either writing data into said bit cell or reading data from said bit cell, said second logic signal turning said third and fourth pull-up transistors on, thereby reducing the drive capability of said first and second inverter pull-up transistors.

17. A memory bit cell comprising cross-coupled first and second inverters, each one of said inverters further comprising a pull-up transistor and a pull-down transistor having series-connected terminals defining a storage node, a first pass transistor coupled between a first bit line and a first one of said storage nodes, a second pass transistor coupled between a second bit line and a second one of said storage nodes, said first and second pass transistors further coupled to a word line for controllably switching said first and second pass transistors on or off, a third pull-up transistor coupled in parallel with said first inverter pull-up transistor and resistively coupled to said first storage node, a fourth pull-up transistor coupled in parallel with said second inverter pull-up transistor and resistively coupled to said second storage node.

18. A bit cell as defined in claim 17, wherein said first and second inverter pull-up transistors are PMOS transistors, and said pull-down transistors, said third and fourth pull-up transistors and said pass transistors are NMOS transistors.

19. A bit cell as defined in claim 18, wherein said series-connected terminals further comprise drain terminals of said respective inverter pull-up and pull-down transistors, a logic high voltage reference signal is applied to a source terminal of each one of said first and second inverter pull-up transistors, a logic low voltage reference signal is applied to a source terminal of each one of said first and second inverter pull-down transistors, a switching terminal of said first inverter pull-up transistor is coupled through a first resistor to a switching terminal of said first inverter pull-down transistor reducing the drive capability of said first inverter pull-up transistor whenever said third pull-up transistor turns on, a switching terminal of said second inverter pull-up transistor is coupled through a second resistor to a switching terminal of said second inverter pull-down transistor reducing the drive capability of said second inverter pull-up transistor whenever said fourth pull-up transistor turns on, said first inverter pull-up and pull-down transistor switching terminals are further coupled to said second inverter series-connected terminals, said second inverter pull-up and pull-down transistor switching terminals are further coupled to said first inverter series-connected terminals, a source-to-drain path of said first pass transistor is coupled between said first bit line and said second storage node, a source-to-drain path of said second pass transistor is coupled between said second bit line and said first storage node, a source-to-drain path of said third pull-up transistor is coupled between said logic high voltage reference signal and said first storage node, a source-to-drain path of said fourth pull-up transistor is coupled between said logic high voltage reference signal and said second storage transistor, a switching terminal of said third pull-up transistor is coupled to a switching terminal of said first pass transistor, and a switching terminal of said fourth pull-up transistor is coupled to a switching terminal of said second pass transistor.

* * * * *